(12) United States Patent
Naito

(10) Patent No.: US 7,199,574 B2
(45) Date of Patent: Apr. 3, 2007

(54) SEMICONDUCTOR TEST APPARATUS

(75) Inventor: Takashi Naito, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/938,386

(22) Filed: Sep. 10, 2004

(65) Prior Publication Data

US 2005/0077891 A1   Apr. 14, 2005

(30) Foreign Application Priority Data

Sep. 12, 2003 (JP) ............... 2003-322095

(51) Int. Cl.
*G01R 31/28* (2006.01)

(52) U.S. Cl. .................... 324/158.1

(58) Field of Classification Search ......... 324/158.1, 324/765, 760, 763, 758; 198/781.08, 686; 414/322; 73/866.5
See application file for complete search history.

(56) References Cited

U.S. PATENT DOCUMENTS

| | | | | |
|---|---|---|---|---|
| 5,670,034 | A | * | 9/1997 | Lowery ............... 205/143 |
| 5,821,440 | A | * | 10/1998 | Khater et al. .......... 73/866.5 |
| 6,023,173 | A | * | 2/2000 | Khater et al. .......... 324/758 |
| 6,040,699 | A | * | 3/2000 | Holmes .............. 324/754 |
| 6,043,442 | A | * | 3/2000 | Park et al. ........... 209/573 |
| 6,157,200 | A | * | 12/2000 | Okayasu ............. 324/753 |
| 6,646,431 | B1 | * | 11/2003 | Parvez et al. ......... 324/158.1 |
| 6,734,694 | B2 | * | 5/2004 | Tauchi et al. ......... 324/765 |

FOREIGN PATENT DOCUMENTS

| | | |
|---|---|---|
| DE | 201 19 289 | 2/2002 |
| EP | 0 526 996 | 2/1993 |
| JP | 06-069296 | 3/1994 |
| JP | 06-300819 | 10/1994 |
| JP | 2597779 | 5/1999 |
| JP | 2002-189037 | 7/2002 |

OTHER PUBLICATIONS

Patent Abstracts of Japan, Publication No.: 06-300819, Publication Date: Oct. 28, 1994, 1 page.
Partial Translation of the Claims for JP2597779 Y2, Publication Date: May 14, 1999, 1 page.
Patent Abstracts of Japan, Publication No.: 06-069296, Publication Date: Mar. 11, 1994, 1 page.
Patent Abstracts of Japan, Publication No.: 2002-189037, Publication Date: Jul. 5, 2002, 1 page.
International Search Report for PCT/JP2004/013048 mailed on Dec. 14, 2004, 2 pages.
Supplementary European Search Report issued in European Application No. EP 04 78 7731 mailed on Sep. 11, 2006, 3 pages.

* cited by examiner

*Primary Examiner*—Ha Tran Nguyen
*Assistant Examiner*—Tung X. Nguyen
(74) *Attorney, Agent, or Firm*—Osha Liang LLP

(57) ABSTRACT

A semiconductor test apparatus comprising a test apparatus main body for generating a test pattern provided to a semiconductor device, a test head which contacts the semiconductor device and provides the test pattern generated by the test apparatus main body for the semiconductor device, a cable for delivering the test pattern to the test head from the test apparatus main body and a movable supporting unit for moving in a direction to release tension when tension occurs in the cable while holding the cable.

4 Claims, 4 Drawing Sheets

SEMICONDUCTOR TEST APPARATUS

The present application claims priority from a Japanese Patent Application No. 2003-322095 filed on Sep. 12, 2003, the contents of which are incorporated herein by reference.

BACKGROUND OF THE INVENTION

1. Field of the Invention

The present invention relates to a semiconductor test apparatus.

2. Description of the Related Art

The semiconductor test apparatus provides the test pattern to the semiconductor device to be tested, receives an output signal from the semiconductor device based on the test pattern and compares the received output signal with an expected value so that it determines pass or failure of the semiconductor device. The test apparatus main body of the semiconductor test apparatus, which generates the test pattern and the expected value, receives an output signal of the tested semiconductor device and compares it with the expected value. The semiconductor device to be tested is laid on a test head and the test apparatus main body connects with the test head through the connection cable.

The test head includes a performance board corresponding to the terminal arrangement of the tested semiconductor device and a pin electronics substrate for connecting the performance board to the connection cable, therein. In case that the type of the semiconductor device to be tested is changed, the direction of the test head is changed in order to exchange the performance board and the electronics substrate in the test head. Accordingly, after exchanging the performance board and the pin electronics substrate, the direction of the test head returns back to the original direction and the new semiconductor device to be tested is laid on the test head, Since the existence of the prior art reference is not recognized at present, the description regarding the prior art is omitted.

In case of changing the direction of the test head, sometimes it happens that the connection cable for connecting the test head to the test device main body is loosened when the direction of the test head is changed with respect to the test apparatus main body. In this case, the loosened cable overlaps and buckles to be broken.

SUMMARY OF THE INVENTION

Therefore, it is an object of the present invention to provide a semiconductor test apparatus, which is capable of overcoming the above drawbacks accompanying the conventional art. The above and other objects can be achieved by a combination of features described in the independent claim. The dependent claims define further-advantageous examples of the present invention.

According to an aspect of the present invention, a semiconductor test apparatus includes a test apparatus main body for generating a test pattern provided to a semiconductor device, a test head which contacts the semiconductor device and provides the test pattern generated by the test apparatus main body to the semiconductor device, a cable for delivering the test pattern to the test head from the test apparatus main body and a movable supporting unit, when tension occurs in the cable, for moving in a direction to release the tension while holding the cable.

The movable supporting unit may hold the cable from below and move downward, when tension occurs in the cable, in order to release the tension.

It is desirable that the movable supporting unit includes a cylindrical member on which the cable is hung and an energizing unit for energizing the cylindrical member upward while holding the cylindrical member rotatably.

It is desirable that the cable is a flat cable in which a plurality of transmission lines is arranged flat.

In case that the transmission cable is an optical fiber, the test apparatus according to the present invention can prevent breaking of the optical fiber.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
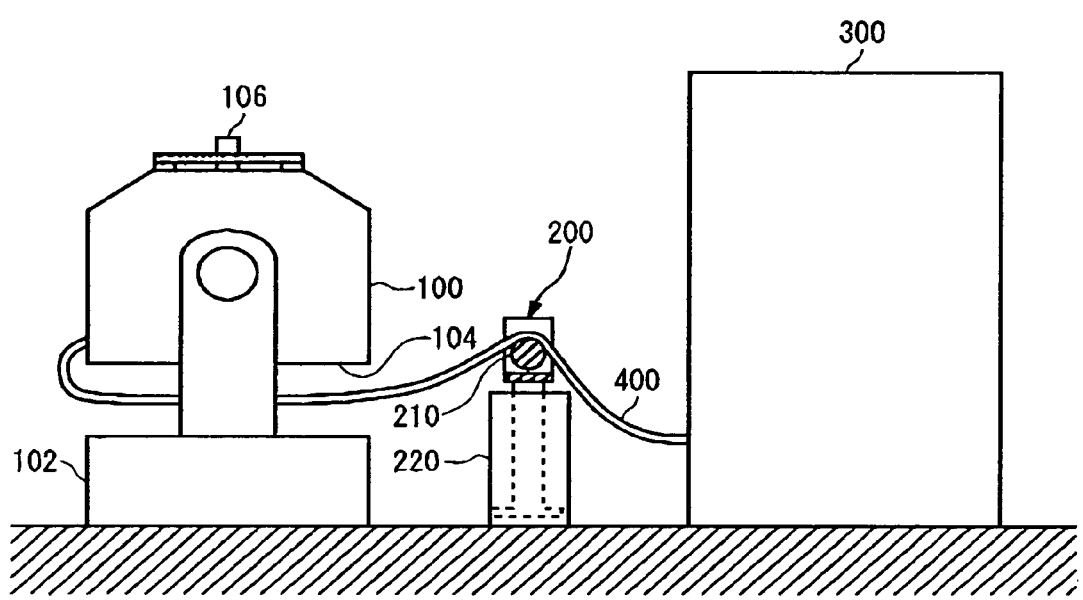
FIG. 1 shows a constitution of a semiconductor test apparatus 10 according to an embodiment of the present invention.

FIG. 1 shows a semiconductor test apparatus 10 according to a first embodiment of the present invention. The semiconductor test apparatus 10 includes a test apparatus main body 300, a test head 100, a movable supporting unit 200 and a connection cable 400. The semiconductor test apparatus of the present invention 10 can prevent breaking of the connection cable 400, such as an optical fiber. The test apparatus main body 300 generates a test pattern which is provided to a semiconductor device 106 to be tested. Moreover, the test apparatus main body 300 determines pass or failure of the semiconductor device 106 by receiving the output signal outputted from the semiconductor device 106 in response to the test pattern and comparing it with the expected value. The connection cable 400 is connected to the test head 100 and the test apparatus main body 300 and delivers the test pattern to the test head 100 from the test apparatus main body 300. Moreover, the connection cable 400 delivers the output signal outputted from the semiconductor device 106 in response to the test pattern to the test apparatus main body 300 from the test head 100.

The test head 100 is held rotatably by a fixed base 102. In case of testing the semiconductor device 106, the semiconductor device 106 is laid on the test head 100. Accordingly, the test head 100 contacts the semiconductor 106 and provides the test pattern generated by the test apparatus main body 300 to the semiconductor device 106. Inside the test head 100, a pin electronics substrate corresponding to the terminal arrangement of the semiconductor device 106 is installed. The pin electronics substrate includes a pattern wiring corresponding to the terminal constitution of the semiconductor device 106, a driver and a comparator, etc. An opening 104 is formed at a side of the test head 100 facing to a side which the semiconductor device 106 is laid. The pin electronics substrate is installed inside of the test head 100 from the opening 104.

The movable supporting unit 200 holding the connection cable 400 moves, when tension occurs in the connection cable 400, in the direction to release the tension. It is desirable that the movable supporting unit 200 supports the connection cable 400 from below and, when tension occurs in the connection cable 400, releases the tension by moving to below. The tension caused by the weight of the connection cable 400 is added to a part of the connection cable 400, which is connected to the test head 100 and the test apparatus main body 300. Moreover, since the connection cable 400 is fixed to the test head 100 and the test apparatus main body 300, stress is concentrated on a fixed part of the connection cable 400. For this reason, it is easy for the connection cable 400 to be broken in a part connected to the test head 100 and test apparatus main body 300. Since the movable supporting unit 200 supports the connection cable 400 from below, the stress, which is applied to a part connected to the test head 100 and the test apparatus main body 300 adds to the connection cable 400, reduces. Accordingly, it is possible to prevent breaking of the connection cable 400.

The movable supporting unit 200 includes a cylindrical member 210 on which the connection cable 400 is hung and an air pressure driving device 220 for energizing the cylindrical member 210 upward while holding the cylindrical member 210 rotatably. Since the cylindrical member 210 has a cylinder shape, the bending radius of the connection cable 400 becomes smaller than the radius of the cylindrical section of the cylindrical member 210. For this reason, it is possible to prevent breaking of the connection cable 400. Moreover, since the cylindrical member 210 is held rotatably, the connection cable 400 is smoothly movable accompanying with the rotation of the cylindrical member 210. For this reason, it is possible to prevent deterioration of the connection cable 400.

It is desirable that the connection cable 400 is a flat cable in which a plurality of the transmission lines such as an optical fiber is arranged flat. Since the flat cable is thin, even when the cable is curved, the thickness in a radius direction of the curved part is smaller than that of bundling of multiple single-core cables. For this reason, the force pulling the flat cable in a circumferential direction for the outside of the curved area is small compared with the case of bundling single-core cables. Accordingly, the flat cable is hardly broken rather than the bundled single-core cables.

Here, when the type of the semiconductor device 106 to be tested is changed, the pin electronics substrate installed inside of the test head 100 is exchanged. In this case, the opening 104 is turned upward by rotating the test head 100 almost 180 degrees with respect to the fixed base 102. Accordingly, after the pin electronics substrate is exchanged, the test head rotates 180 degrees in the reverse direction and the opening 104 is turned downward. Accordingly, the semiconductor device 106 is laid on the test head 100 and is to be tested.

Figure 2:
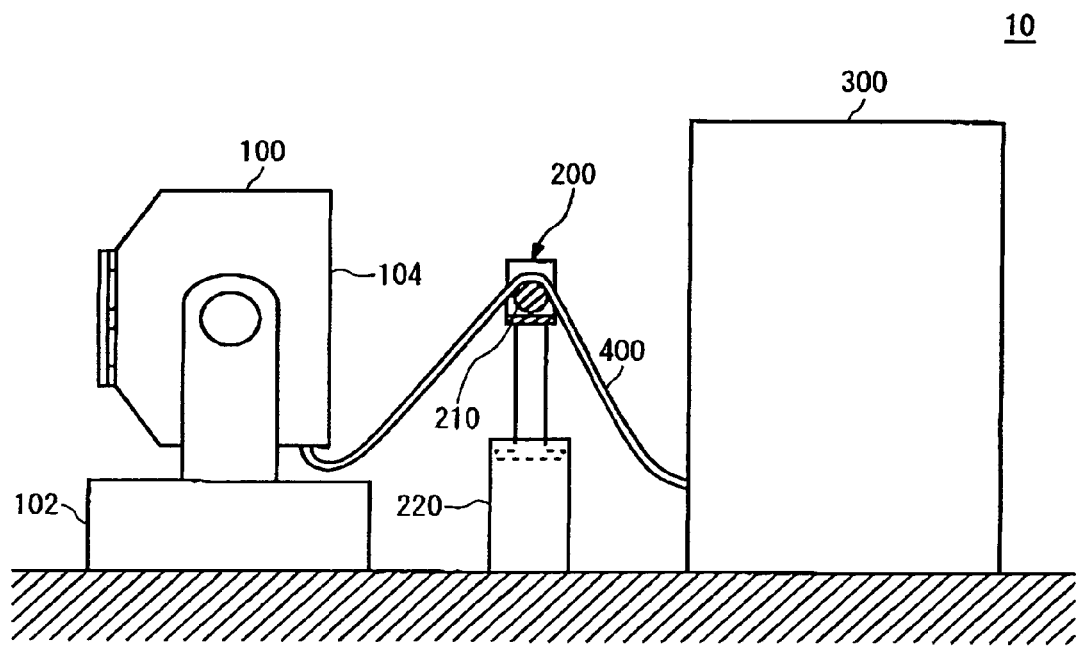
FIG. 2 shows a situation during the rotation of a test head 100 to exchange a pin electronics substrate.

FIG. 2 shows a situation during the rotation of the test head 100 to exchange the pin electronics substrate. If the test head 100 rotates, the connection cable 400 becomes loose. If the connection cable 400 becomes loose, a part of the connection cable 400 may be broken by overlapping and buckling. Although, in the present example, since the cylindrical member 210 energizing the connection cable 400 upward, the looseness of the connection cable 400 can be prevented by displacing the cylindrical member 210 upward when the looseness occurs in the connection cable 400. According to this, it is possible to prevent buckling of the connection cable 400. Accordingly, it is possible to prevent breaking of the connection cable 400.

After exchanging the pin electronics substrate, the test head 100 makes the opening 104 return in an original downward direction by rotating in the reverse direction. In this case, the connection cable 400 is pulled toward the test head 100 accompanying with the rotation of the test head 100. According to this, the tension occurs in the connection cable 400. The cylindrical member 210 of the movable supporting unit 200 releases the tension occurring in the connection cable 400 by being displaced downward, which is in the direction in which the tension occurring in the connection cable 400 is to be released. Accordingly, it is possible to prevent breaking of the connection cable 400 caused by applying excessive tension, especially at the place where the connection cable 400 is connected to the test head 100 and the test apparatus main body 300.

In addition, although the case of rotation of the test head 100 is described in the present embodiment, when the test head 100 moves away from the test apparatus main body 300, it is possible to release the tension occurring in the connection cable 400 by descending the cylindrical member 210. Moreover, in case that the test head 100 moves toward the test apparatus main body 300, it is possible to prevent the looseness occurring in the connection cable 400 by ascending the cylindrical member 210. In addition, when the test head 100 ascends toward the test apparatus main body 300, it is possible to prevent the looseness occurring in the connection cable 400 by the ascending of the cylindrical member 210, and when the test head 100 descends toward the test apparatus main body 300, it is possible to release the tension occurring in the connection cable 400 by descending the cylindrical member 210.

Figure 3:
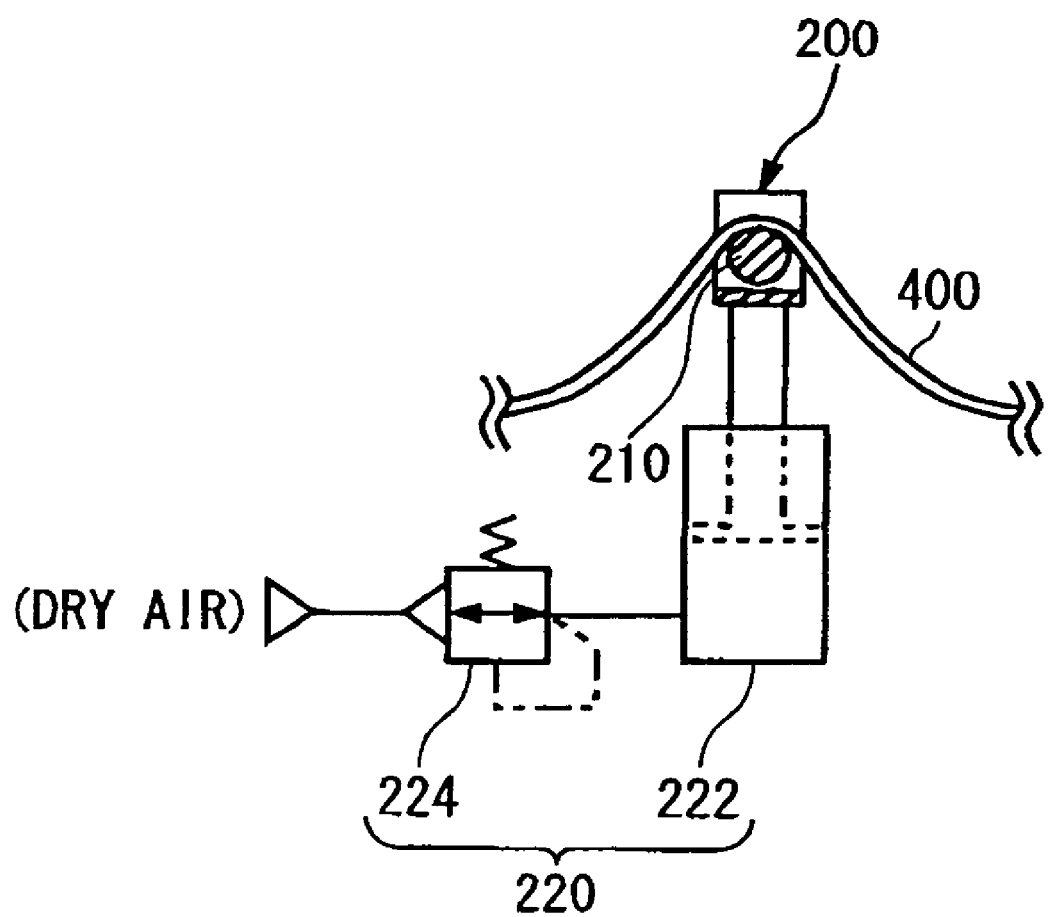
FIG. 3 shows an example of the detailed constitution of a movable supporting unit 200.

FIG. 3 shows an example of the detailed constitution of the movable supporting unit 200. The air pressure driving device 220 includes a low friction air cylinder 222 and a precision regulator 224. The low friction air cylinder 222 drives a piston by the pressure of inserted gas. In the present example, the gas inserted into the low friction air cylinder 222 is, for example, dry air.

The precision regulator 224 inserts gas into the low friction air cylinder 222 and keeps the pressure of gas in the low friction air cylinder 222 constant. The pressure of the gas in the low friction air cylinder 222 is set up in order that it is smaller than the pressure which the piston applies on the gas in the low friction air cylinder 222 according to a load acting on the cylindrical member 210 when the connection cable 400 become most loose and the piston ascends to the uppermost position within its movable range, and it is larger than the pressure which the piston applies on gas in the low friction air cylinder 222 in case that the connection cable 400 becomes least loose and the piston of the low friction air cylinder descends to the lowermost position within its movable range. It is desirable that the pressure of gas in the low friction air cylinder 222 is set up in order to become approximately equal to an average value between the pressure applied on the gas in the low friction air cylinder 222 by the piston when the piston ascends to the uppermost position and the pressure applied on the gas in the low friction air cylinder 222 by the piston when the piston descends to the lowermost position.

The precision regulator 224 keeps the pressure of gas in the low friction air cylinder 222 constant so that the air pressure driving device 220 does not participate in the displacement of the cylindrical member 210 and can give a specific energizing force to the connection cable 400. Moreover, it is possible to correspond to the connection cable 400 with various weights by controlling the pressure of the gas in the low friction air cylinder 222.

In addition, as another example, the air pressure driving device 220 may be an oil pressure driving device for driving the piston according to the pressure of an inserted oil. As another example, the air pressure driving device 220 may be a gas spring having an spring effect according to a spring or repulsive force of gas enclosed in a cylinder.

Figure 4:
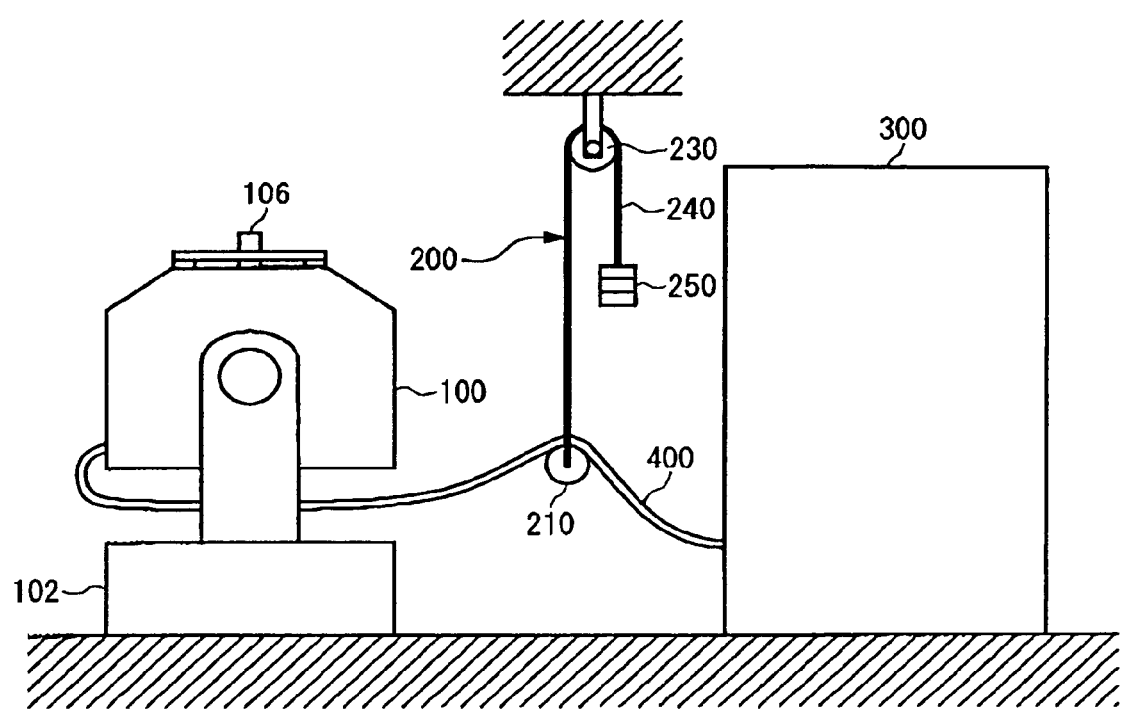
FIG. 4 shows another example of the constitution of the movable supporting unit 200.

FIG. 4 shows another example of the constitution of the movable supporting unit 200. The movable supporting unit 200 includes a cylindrical member 210, a pulley 230, a wire 240 and a weight 250. The wire 240 is hung on the pulley 230 and holds the cylindrical member 210 at one end rotatably. The weight 250 is attached to the wire 240 at the other end of the wire 240. The cylindrical member 210 supports the connection cable 400 from below and energizes the connection cable 400 upward according to the load of the weight 250.

In the present example, in case that the looseness occurs in the connection cable 400, it is possible to remove the looseness of the connection cable 400 by displacing the cylindrical member 210 according to the load of the weight 250. According to this, it is possible to prevent buckling and breaking of the connection cable 400. In addition, the movable supporting unit 200 may energize the connection cable 400 upward by using a spring balancer for reducing weight of the connection cable 400 hung on the cylindrical member 210 according to a spring force.

As obvious from the description above, according to the semiconductor test apparatus 10 of the present embodiment, the connection cable 400 can be arranged appropriately, without breaking of the connection cable 400 when the looseness occurs in the connection cable 400.

According to the present invention, when the looseness occurs in the connection cable to connect the test apparatus main body to the test head, it is possible to embody the semiconductor test apparatus of which the connection cable is arranged appropriately without breaking.

According to the present invention, the semiconductor test apparatus can arrange the connection cable, which connects the test apparatus main body and the test head, appropriately, without breaking of the cable when the connection cable becomes loose.

Although the present invention has been described by way of exemplary embodiments, it should be understood that those skilled in the art might make many changes and substitutions without departing from the spirit and the scope of the present invention which is defined only by the appended claims.

What is claimed is:

1. A semiconductor test apparatus comprising:
    a test apparatus main body for generating a test pattern provided to a semiconductor device;
    a test head which contacts said semiconductor device and provides said test pattern generated by said test apparatus main body to said semiconductor device;
    a cable for transferring said test pattern to said test head from said test apparatus main body wherein the cable is a flat cable in which a plurality of transmission lines are arranged flat; and
    a movable supporting unit for holding said cable, said movable supporting unit, when tension occurs in said cable, moving in a direction to release said tension;
       wherein said movable supporting unit comprises a cylindrical member around which the cable is flatly arranged and an energizing unit for energizing said cylindrical member upward,
    the test head is held rotatably by a fixed base,
    a width direction of the flat cable is substantially parallel to an axial direction of the cylindrical member,
    and wherein the rotation axis of the test head is substantially horizontal and is substantially parallel to the axial direction of the cylindrical member.

2. A semiconductor test apparatus as claimed in claim 1, wherein said movable supporting unit holds said cable from below and moves downward, when tension occurs in said cable, in order to release said tension.

3. A semiconductor test apparatus as claimed in claim 1, wherein said energizing unit holds said cylindrical member rotatably.

4. A semiconductor test apparatus as claimed in claim 1, wherein said transmission cable is an optical fiber.

* * * * *